(12) United States Patent
Lai et al.

(10) Patent No.: US 12,068,036 B2
(45) Date of Patent: Aug. 20, 2024

(54) ADAPTIVE ERASE PULSE WIDTH MODULATION BASED ON ERASE SUSPEND DURING ERASE PULSE RAMPING PERIOD

(71) Applicant: Micron Technology, Inc., Boise, ID (US)

(72) Inventors: Jiun-horng Lai, Kamakura (JP); Pitamber Shukla, Boise, ID (US); Ching-Huang Lu, Fremont, CA (US); Chengkuan Yin, Tokyo (JP); Yoshiaki Fukuzumi, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 192 days.

(21) Appl. No.: 17/887,765

(22) Filed: Aug. 15, 2022

(65) Prior Publication Data

US 2023/0402103 A1    Dec. 14, 2023

Related U.S. Application Data

(60) Provisional application No. 63/350,992, filed on Jun. 10, 2022.

(51) Int. Cl.
*G11C 16/16* (2006.01)
*G11C 16/26* (2006.01)
*G11C 16/32* (2006.01)

(52) U.S. Cl.
CPC .............. *G11C 16/16* (2013.01); *G11C 16/26* (2013.01); *G11C 16/32* (2013.01)

(58) Field of Classification Search
CPC ...................................................... G11C 16/16
USPC ..................................................... 365/185.29
See application file for complete search history.

(56) References Cited

U.S. PATENT DOCUMENTS

| 10,643,711 B1* | 5/2020 | Yuan | G11C 16/32 |
| 2021/0173580 A1* | 6/2021 | Guda | G06F 3/0652 |
| 2022/0293194 A1* | 9/2022 | Ramanan | G11C 16/0483 |
| 2022/0336029 A1* | 10/2022 | Zhao | G11C 16/3477 |

* cited by examiner

*Primary Examiner* — Muna A Techane
(74) *Attorney, Agent, or Firm* — Lowenstein Sandler LLP

(57) ABSTRACT

A memory device includes a memory array comprising memory cells and control logic. The control logic performs operations including: causing a first erase pulse to be applied to a memory line of the memory array to perform an erase operation, the memory line being a conductive line coupled to a string of the memory cells; suspending the erase operation in response to receipt of a suspend command during a ramping period of the first erase pulse; recording a suspend voltage level of the first erase pulse when suspended; causing the erase operation to be resumed in response to an erase resume command; selectively modifying a pulse width of a flattop period of a second erase pulse based on the suspend voltage level; and causing the second erase pulse to be applied to the memory line during a resume of the erase operation.

20 Claims, 15 Drawing Sheets

| $350_0$ | $350_1$ | $350_2$ | $350_3$ |
|---|---|---|---|
| $Block_0$ $250_0$ | $Block_0$ $250_0$ | $Block_0$ $250_0$ | $Block_0$ $250_0$ |
| $Block_1$ $250_1$ | $Block_1$ $250_1$ | $Block_1$ $250_1$ | $Block_1$ $250_1$ |
| $Block_2$ $250_2$ | $Block_2$ $250_2$ | $Block_2$ $250_2$ | $Block_2$ $250_2$ |
| $Block_3$ $250_3$ | $Block_3$ $250_3$ | $Block_3$ $250_3$ | $Block_3$ $250_3$ |
| $Block_4$ $250_4$ | $Block_4$ $250_4$ | $Block_4$ $250_4$ | $Block_4$ $250_4$ |
| ⋮ | ⋮ | ⋮ | ⋮ |
| $Block_{L-4}$ $250_{L-4}$ | $Block_{L-4}$ $250_{L-4}$ | $Block_{L-4}$ $250_{L-4}$ | $Block_{L-4}$ $250_{L-4}$ |
| $Block_{L-3}$ $250_{L-3}$ | $Block_{L-3}$ $250_{L-3}$ | $Block_{L-3}$ $250_{L-3}$ | $Block_{L-3}$ $250_{L-3}$ |
| $Block_{L-2}$ $250_{L-2}$ | $Block_{L-2}$ $250_{L-2}$ | $Block_{L-2}$ $250_{L-2}$ | $Block_{L-2}$ $250_{L-2}$ |
| $Block_{L-1}$ $250_{L-1}$ | $Block_{L-1}$ $250_{L-1}$ | $Block_{L-1}$ $250_{L-1}$ | $Block_{L-1}$ $250_{L-1}$ |
| $Block_L$ $250_L$ | $Block_L$ $250_L$ | $Block_L$ $250_L$ | $Block_L$ $250_L$ |
| $240_0$ | $240_1$ | $240_2$ | $240_3$ |

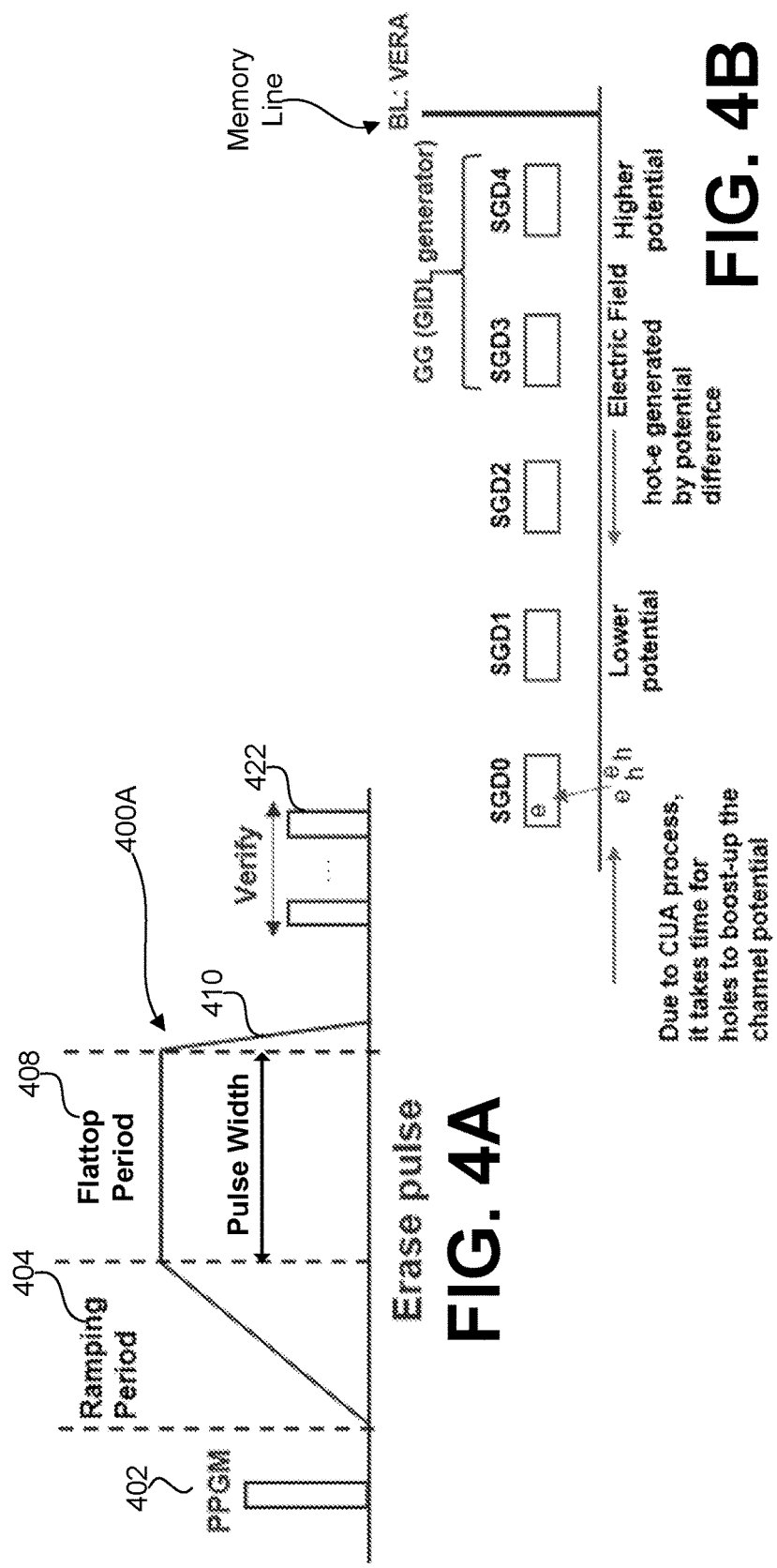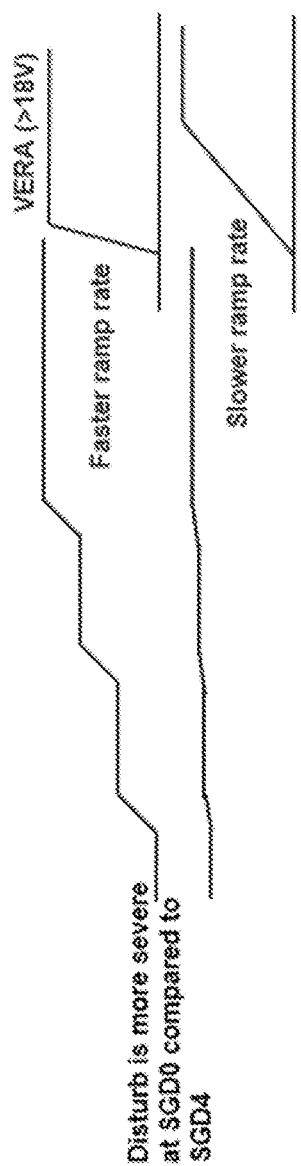

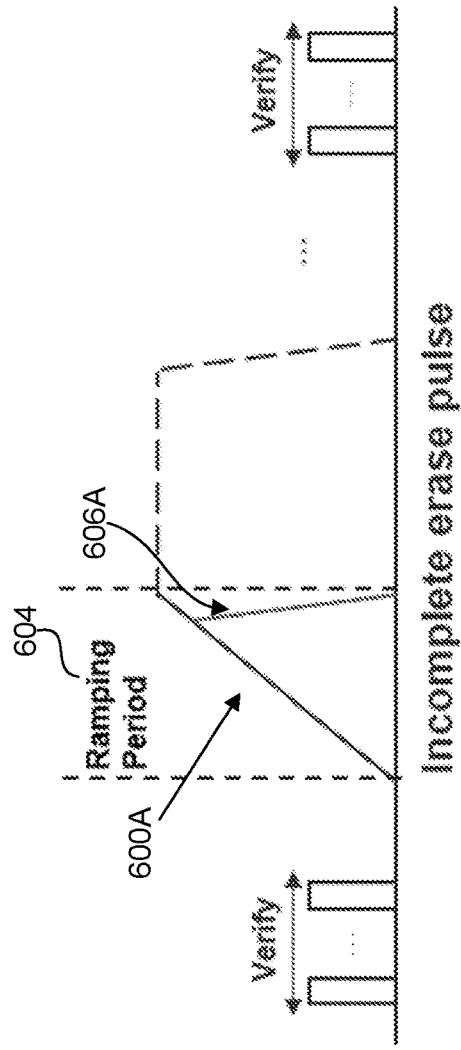
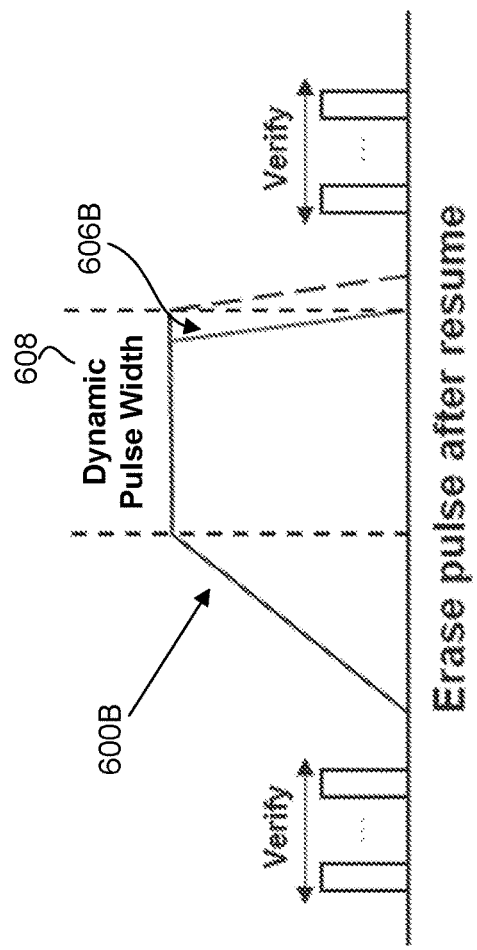

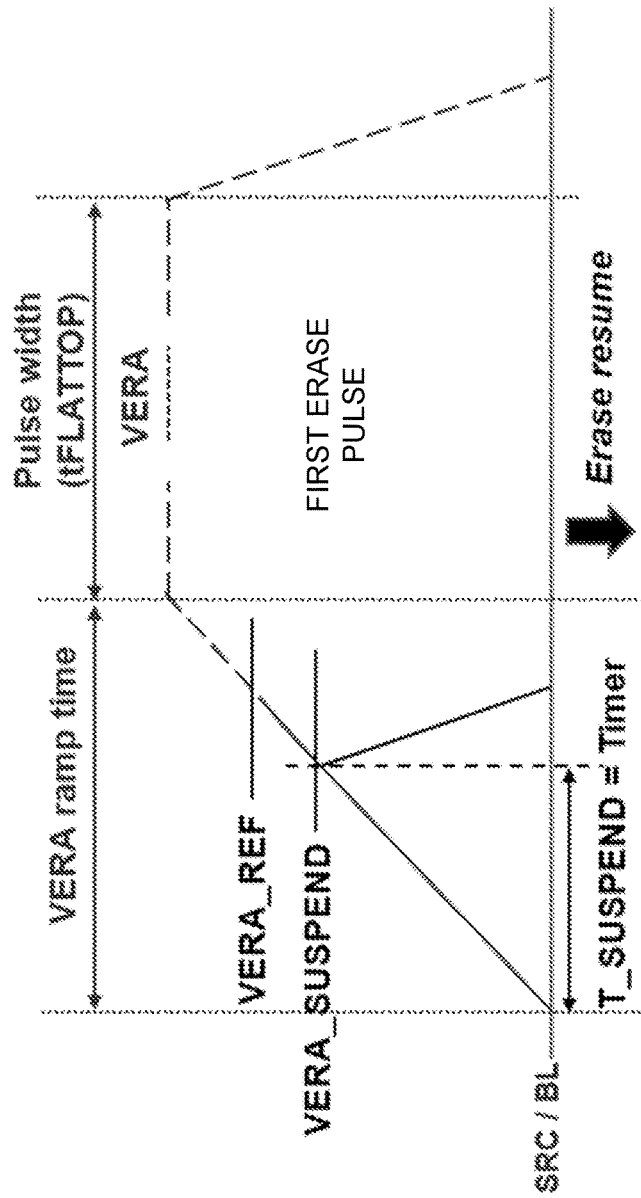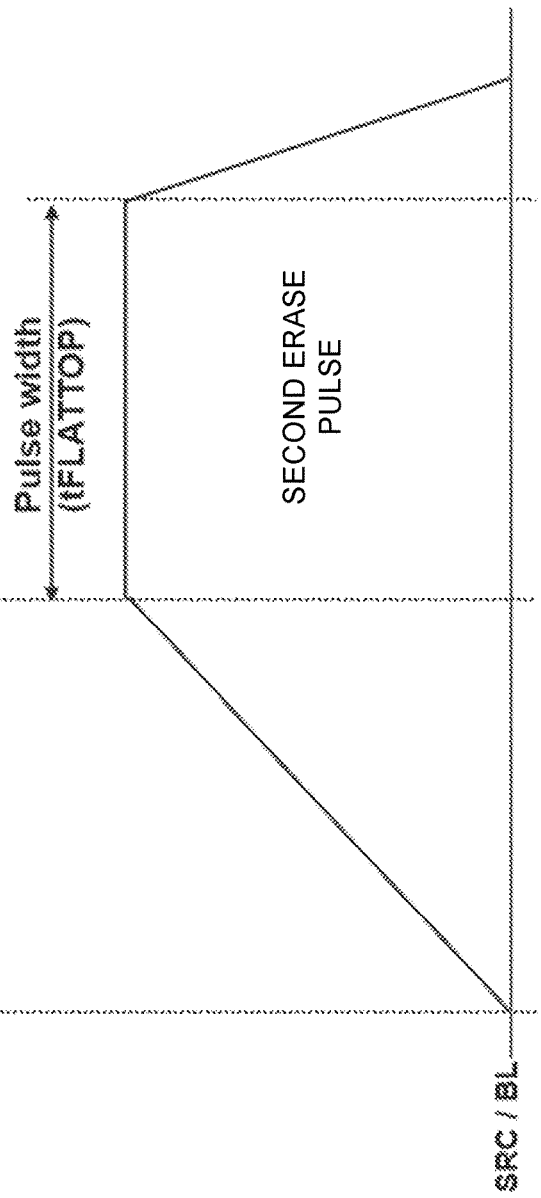

ADAPTIVE ERASE PULSE WIDTH MODULATION BASED ON ERASE SUSPEND DURING ERASE PULSE RAMPING PERIOD

REFERENCE TO RELATED APPLICATION

This application claims the benefit of U.S. Provisional Patent Application No. 63/350,992, filed Jun. 10, 2022, the entirety of which is incorporated herein by reference.

TECHNICAL FIELD

Embodiments of the disclosure are generally related to memory sub-systems, and more specifically, relate to adaptive erase pulse width modulation based on erase suspend during an erase pulse ramping period.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 3 is a block schematic of a portion of an array of memory cells as could be used in a memory of the type described with reference to FIG. 1B according to an embodiment.

FIG. 4A is a simplified voltage waveform depiction of an erase pulse according to an embodiment.

FIG. 4B is a simplified block diagram of how a memory line being ramped to an erase voltage affects a number of memory cells coupled to the memory line according to an embodiment.

FIG. 4C is an example graph illustrating varying hot-e injection-type disturb effects depending on a ramp rate of the erase voltage according to various embodiments.

FIG. 6A is an example waveform of an incomplete erase pulse that is suspended during a ramping period of an erase pulse according to an embodiment.

FIG. 6B is an example waveform of a subsequent erase pulse having a dynamically adjusted pulse width according to an embodiment.

FIG. 9A is an example waveform of an erase pulse such as in FIG. 7 where a suspend voltage level does not satisfy a reference voltage according to an embodiment.

FIG. 9B is an example waveform of a subsequent erase pulse that is applied to the memory line after resuming an erase operation that was suspended as in FIG. 9A according to some embodiments.

DETAILED DESCRIPTION

Figure 1A:
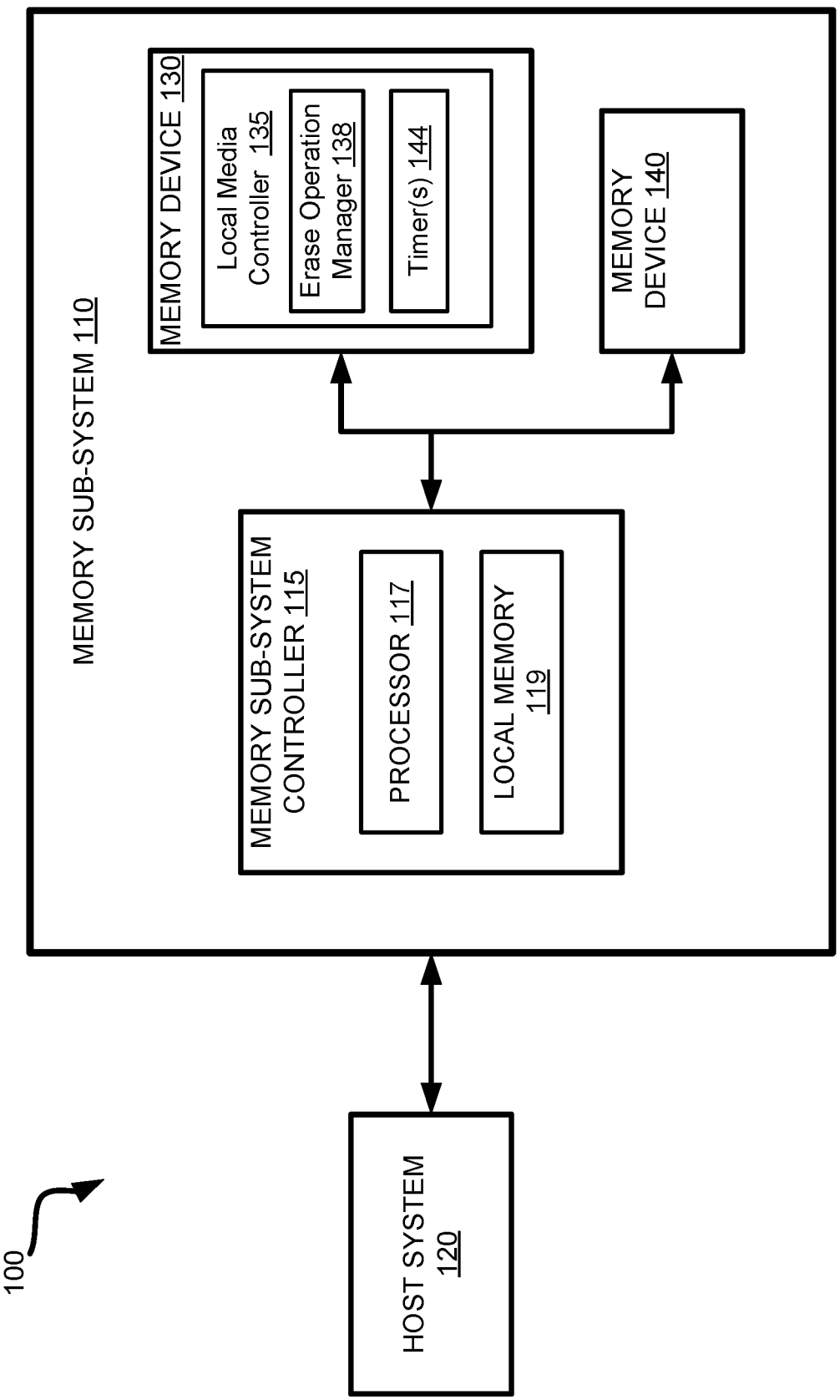
FIG. 1A illustrates an example computing system that includes a memory sub-system in accordance with some embodiments.

Embodiments of the present disclosure are directed to adaptive erase pulse width modulation based on erase suspend during an erase pulse ramping period. A memory device can be a non-volatile memory device. One example of non-volatile memory devices is a negative-and (NAND) memory device. Other examples of non-volatile memory devices are described below in conjunction with FIG. 1A. In certain memory devices such as NAND (or flash) memory devices, memory cells are erased before the memory cells are programmed, generally referred to as program/erase cycles.

In these memory devices, when performing an erase operation on memory cells of a string (or sub-block), an erase pulse is applied to a memory line (e.g., bit line, common source voltage line, or other conductive line coupled to a string of memory cells) to ramp voltages of a selected string of the memory cells up to an erase voltage (VERA), at which voltage level the memory cells can be completely erased. Further, it is common to erase an entire block of multiple strings of memory cells at the same time. The erase voltage is typically greater than a particular voltage, e.g., than typical programming voltages. When a ramping period of the erase pulse is increased up to the erase voltage at a fast ramp rate (e.g., a ramp rate exceeding a certain threshold), a hot-e injection-type disturb can occur that causes a select gate (SG) transistor farthest away from the memory line (referred to as SGD0) to experience a threshold voltage (Vt) trap-up issue in which memory cells trap charge, impacting the stability of the Vt of the SG transistors. The SG transistors are controlled to turn on and turn off a string, typically a sub-block of memory cells, in order to read, program, or erase the memory cells. Thus, the lack of stability of the Vt levels of the SG transistors can lead to program and/or read failures of corresponding strings of memory cells.

In certain memory devices, the hot-e injection-type disturb is caused by gate-induced drain leakage (GIDL) of a channel or pillar of a memory array, for example, particularly within 3D-NAND flash with a circuit under array (CUA) design. If an energy band bends at the oxide interface of field-effect transistors (particularly a FinFET) is greater than or equal to the energy band gap $E_g$ of the drain material, band-to-band tunneling can take place. The electrons in the valence band of an n-type drain tunnel through the thinned band gap into the conduction band between the gate and drain, and are collected at the drain contact to be a part of the drain current. The reaming holes, however, are collected at the substrate contact (the source contact in the case of a FinFET on an silicon-on-insulator (SOI) substrate) and can contribute to the substrate (source) current leakage.

In such memory devices, the CUA process takes longer to boost-up the channel potential compared to non-CUA process because there are no free holes under the pillar in the CUA process. If the erase voltage is ramped too fast (as discussed), the potential under the bit (or memory) line and the SGD4 transistor can be pulled up faster compared to the channel potential at the word line (WL) and SGD0 transistor, which is still ramping to catch up to VERA. Once this happens, the NAND string associated with the SGD0 transistor may be incorrectly turned on or off during program, resulting is possibly severe program/read failures.

Aspects of the present disclosure address the above and other deficiencies by causing the ramping period to be more gradual, e.g., have a slower ramp rate compared to typical ramp rates (compare waveforms of FIG. 4C as an example). In this way, holes are allowed more time (than is typical with faster ramp rates) to boost-up the channel potential so that the string of memory cells farthest from the memory line can be erased without experiencing the Vt trap-up issue. A challenge with a slower ramp rate during the ramping period, however, is that there is a statistically-higher chance of the erase operation being suspended during the ramping period and also the erase operation is lengthened, both of which can impact quality of service (QoS) due to increased latencies. Further, on resume after the suspend, the memory cells that pass through a resume erase operation can be at risk of being over-erased, making those memory cells also less reliable for future programming. A suspend command is often received (e.g., from a host) in order for the memory device to handle a priority command such as a read command before completing the erase operation.

In various embodiments, to address these additional deficiencies associated with the slower ramp rate, control logic of the memory device (such as on the NAND) can detect that the erase operation was suspended during the ramping period of a first (or original) erase pulse and perform additional operations during a resume of the erase operation, e.g., to avoid over-erasing the memory cells and that can shorten the resume erase period. For example, the control logic can retrieve, from its internal memory, a suspend voltage level of the first erase pulse that was recorded in the internal memory when the erase operation was suspended. The suspend voltage level is the voltage to which the memory cell had been charged when the erase operation was suspended in response to a suspend command. The logic can further selectively modify a pulse width of a flattop period (e.g., a period after the erase pulse has plateaued at the erase voltage) of a second erase pulse based on the suspend voltage level. The second erase pulse is a subsequent erase pulse that follows the first erase pulse during a resume of the erase operation. The control logic further causes the second erase pulse to be applied to the memory line during the resume of the erase operation. In this way, the pulse width (or erasure period) of the second erase pulse can be dynamically changed to avoid over-erasing the memory cells coupled to the memory line.

In at least some embodiments, the control logic determines whether the ramping period of the first erase pulse (before suspend) reached a reference voltage that is set to a majority of the erase voltage, or VERA (e.g., is within a predetermined percentage of the erase voltage that is close enough to VERA to begin erasing memory cells). For example, the control logic can identify a reference voltage associated with the ramping period of the first erase pulse that satisfies (at least reaches) a threshold percentage of an erase voltage of the first erase pulse (e.g., is within a predetermined percentage of the erase voltage that is close enough to VERA to begin erasing memory cells).

In these embodiments, the control logic can then decide whether to modify the pulse width of the flattop period based on whether this reference voltage was satisfied. In other words, if the suspend voltage level does not satisfy the reference voltage, the control logic can employ a default flattop period of the pulse width for the second erase pulse, as no over-erasure is at risk and the default flattop period will ensure full erasure of the memory cells. If, however, the suspend voltage level does satisfy the reference voltage, the control logic can reduce the pulse width of the second erase pulse by a time difference between, during the ramping period of the first erase pulse, reaching the suspend voltage level and reaching the reference voltage. This reduction in the flattop period can both avoid over-erasure of the memory cells coupled to the memory line and reduce the time required to complete the resume erase operation.

Therefore, advantages of the systems and methods implemented in accordance with some embodiments of the present disclosure include, but are not limited to, significant improvement of QoS related to memory performance, e.g., reducing latency as a result of shortening the pulse width, when appropriate, of the subsequent erase pulse upon resuming an erase operation. Further, the slower ramp rate of the ramping period of an erase pulse avoids the charge trap-up issue described previously due to significantly lessening GIDL within the string or sub-block being erased. Other advantages will be apparent to those skilled in the art of memory operations, to include erase operations, associated with a memory device discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are formed onto a silicon wafer in an array of columns (also hereinafter referred to as bit lines) and rows (also hereinafter referred to as word lines). A word line can refer to one or more rows of memory cells of a memory device that are used with one or more bit lines to generate the address of each of the memory cells. The intersection of a bit line and word line constitutes the address of the memory cell.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, control logic of the local media controller 135 (e.g., which includes control logic) can implement an erase operation manager 138. The erase operation manager 138 can manage the handling of erase operations, suspend commands, and resume operations that are performed after intervening, higher-priority memory commands are completed. In some embodiments, the erase operation manager 138 is integrated in whole or in part within the memory sub-system controller 115 and/or the host system 120. In various embodiments, the local media controller 135 further includes or is coupled to one more timers 144 that can be used to track a time duration of each erase operation before being suspended in response to a suspend command, as well as other time periods. The one or more timers 144 can thus be employed to determine the suspend pulse period as well as a time until reaching a particular reference voltage, which is a threshold percentage of the erase voltage during the ramping period, as will be discussed. In at least some embodiments, the memory device 130 further includes internal memory to which the reference voltage, the suspend voltage level, and other data is recorded or stored.

Figure 1B:
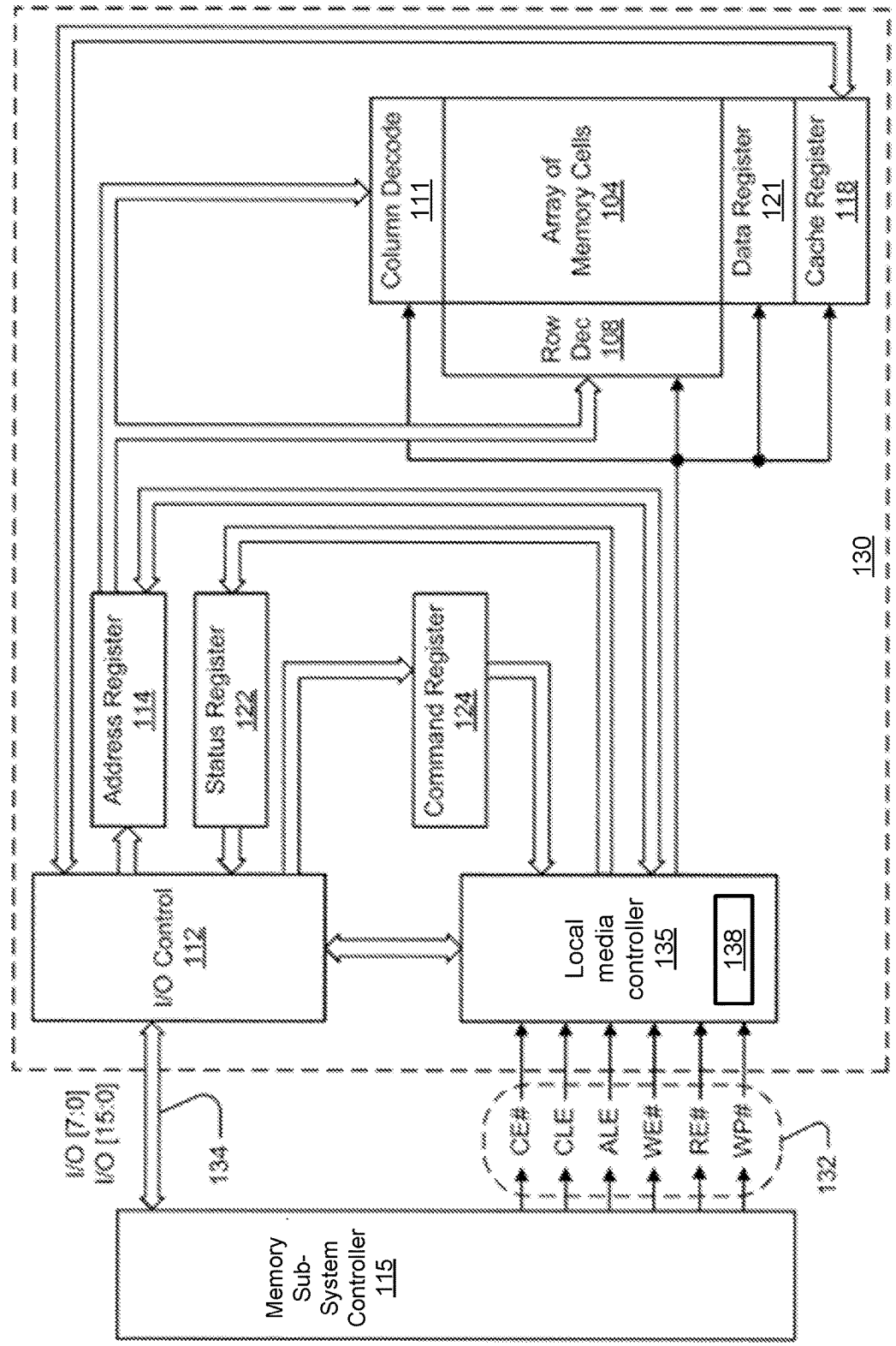
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and the local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. In at least some embodiments, the local media controller 135 includes the erase operation manager 138. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer of the memory device 130. The page buffer can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
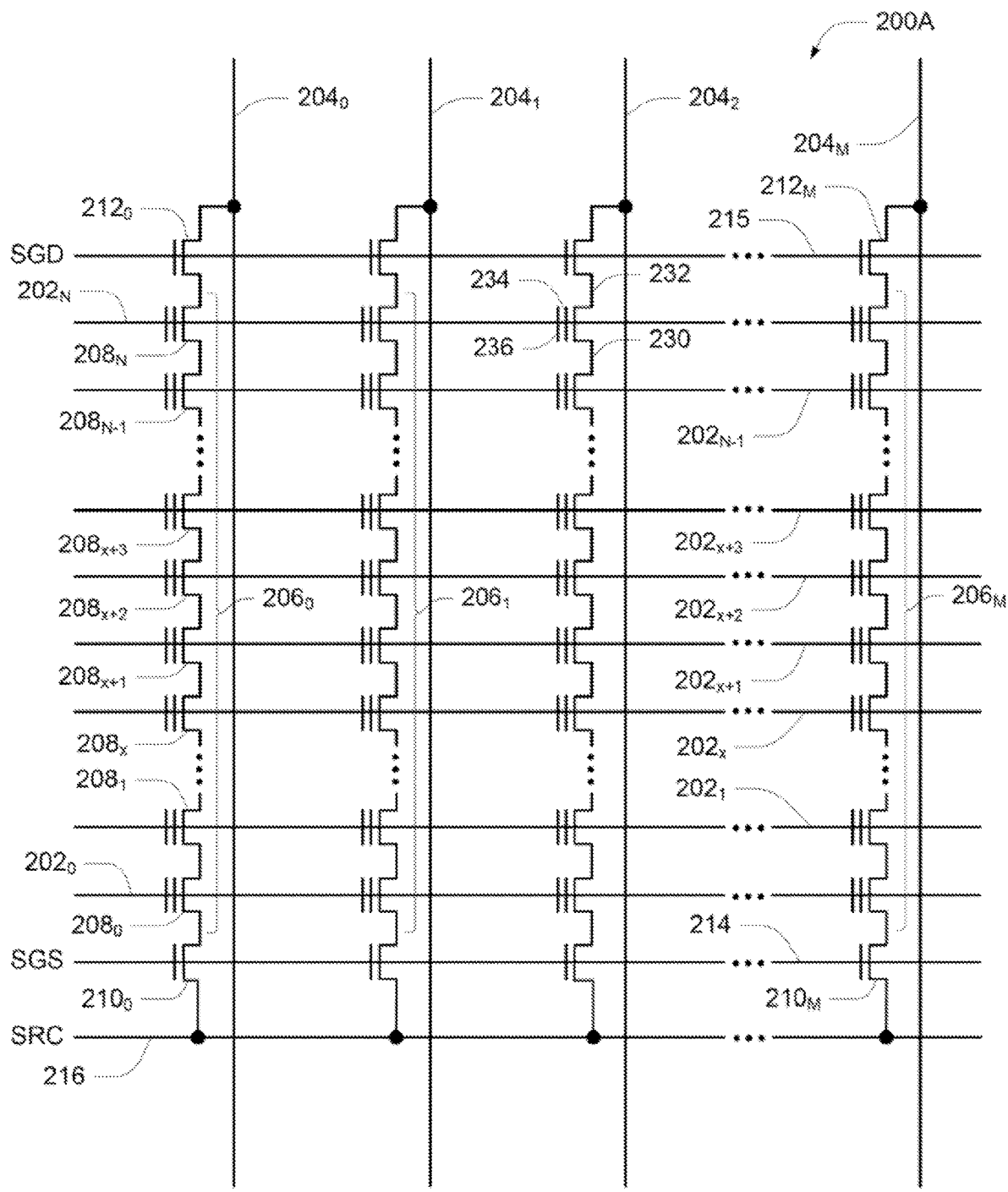
FIG. 2A-2C are schematics of portions of an array of memory cells as could be used in a memory of the type described with reference to FIG. 1B according to an embodiment.
Figure 2B:
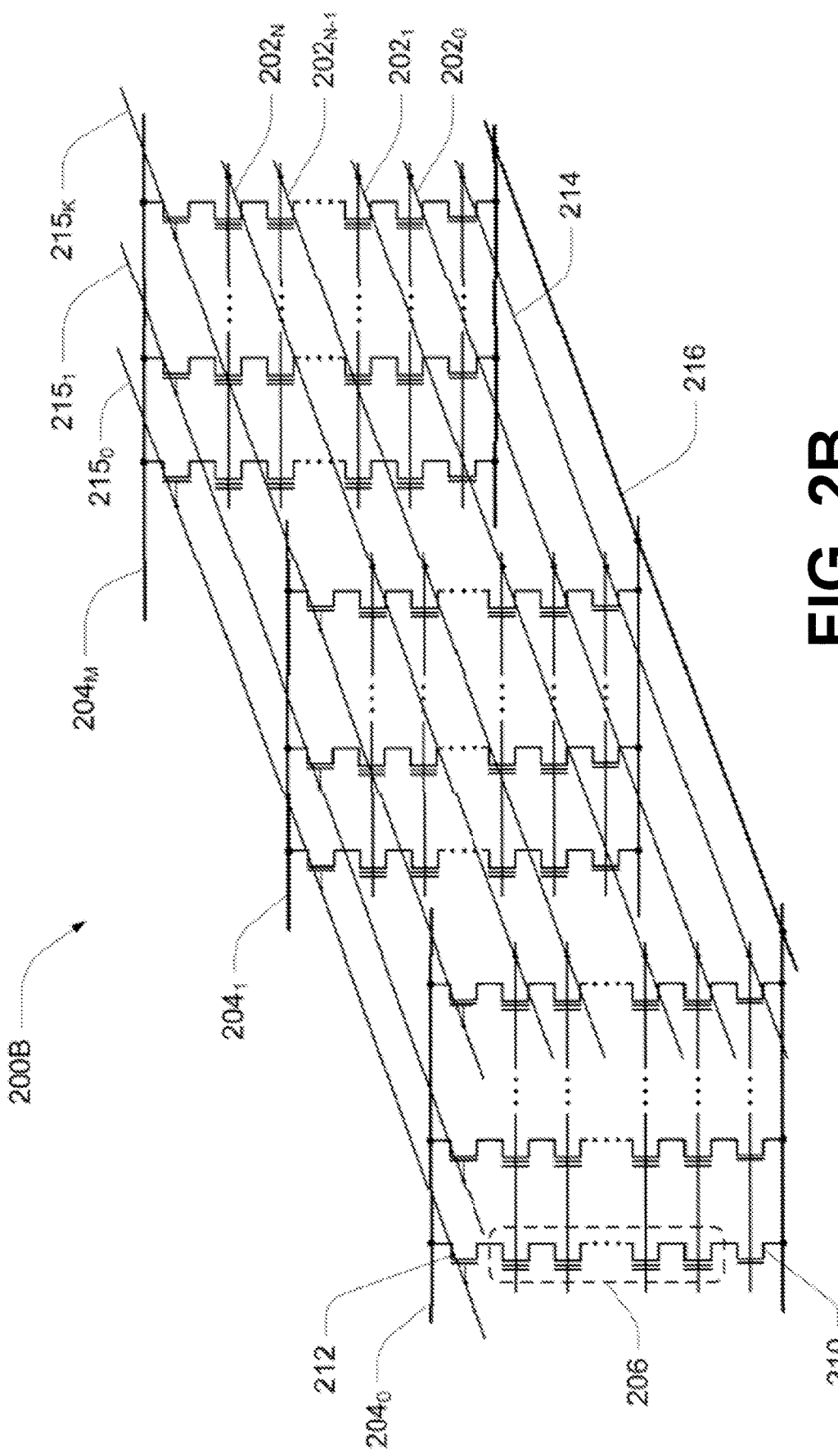
Figure 2C:
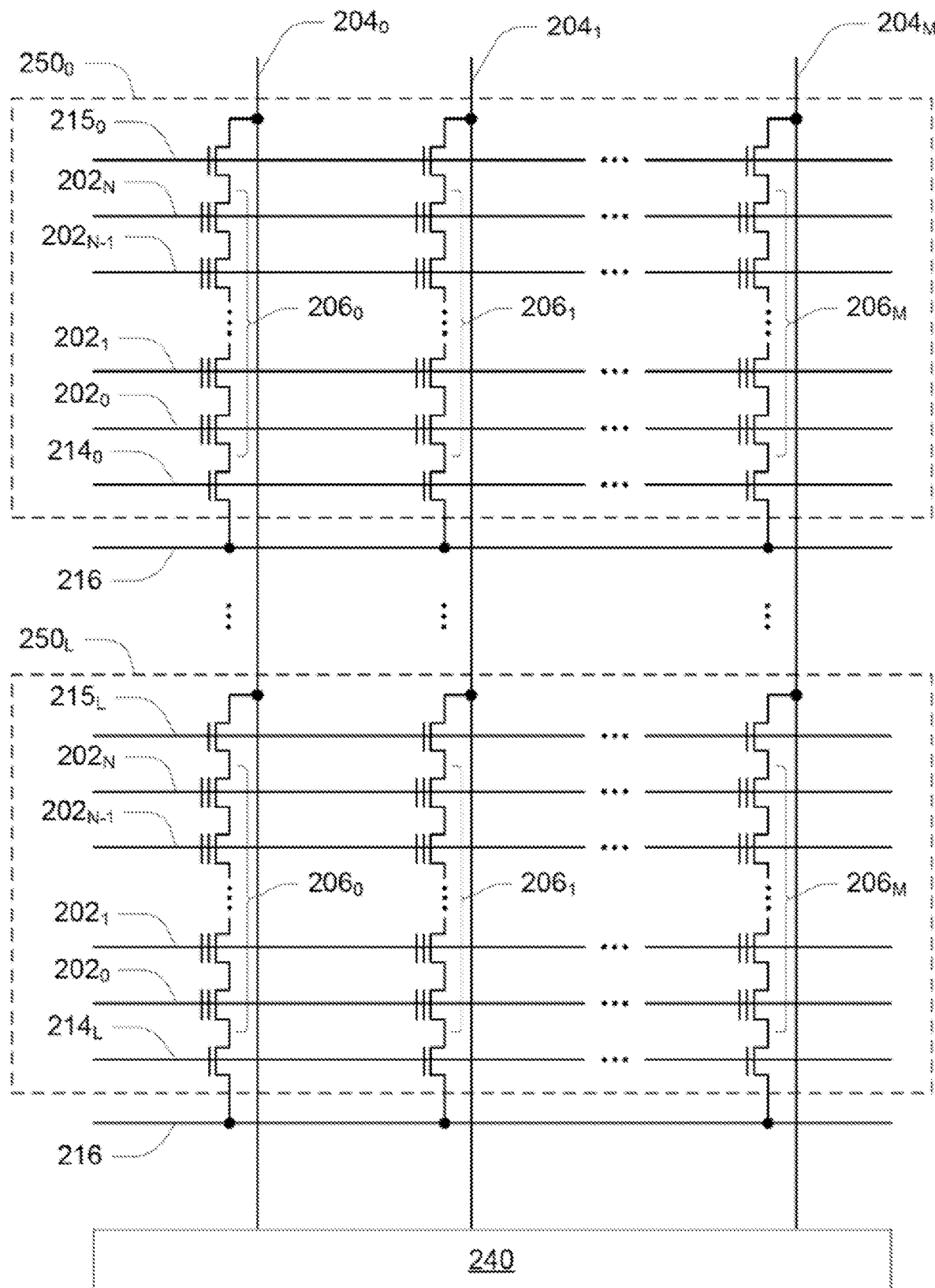

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

In some embodiments, the drain select line (SGD) and source select line (SGS) are separated and biased to different sources or to a commonly shared source. Further, the SGD and SGS lines can be ones of several layers of memory sub-blocks, each layer that can include various connections as explained above. Further, the common source 216 (SRC) can be a plate that can be fully or partially segmented or may be full connected.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2A can be a quasi-two-dimensional memory array and can have a generally planar structure, e.g., where the common source 216, NAND strings 206 and bit lines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2A, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can each be selectively connected to a bit line $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 ("erase blocks") that can be erased together in a single erase operation. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bit lines $204_0$-$204_M$ can be connected (e.g., selectively connected) to a buffer portion 240, which can be a portion of the page buffer of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bit lines 204.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

With continued reference to FIGS. 1B; 2A-2C, during a true erase sub-operation (during which memory cells are actually being erased), the local media controller 135 (e.g., the erase operation manager 138) can cause a common source voltage line, e.g., the SRC 216 (FIG. 2A), to be ramped to an erase voltage (VERA) with an erase pulse (see FIG. 4A) while the select gates $210_0$ to $210_M$ (SGS transistors) are turned on. Ramping to this high bias erase voltage, and the subsequent recovery from this voltage ramping, takes a significant amount of time. Concurrently, the erase operation manager 138 can cause the select gates $212_0$ to $212_M$ (FIG. 2A) to be turned off to enable the drains of the select gates $212_0$ to $212_M$ to float, which causes the bit lines $204_0$ to $204_M$ to also float. Further, the erase operation manager 138 can couple the word lines 202 (FIG. 2A) to ground, e.g., zero volts, or retain the word lines 202 at a low voltage, as illustrated in FIG. 4. This set of voltage levels at the memory array 200A can create an erase potential that causes the memory cells $208_0$ to $208_N$ to be erased, e.g., forces electrons to exit through a body of each memory cell and out the floating bit lines $204_0$ to $204_M$.

In other embodiments, the reverse can be done so the select gates $210_0$ to $210_M$ are turned off, causing the SRC line 216 to float while the voltage of the bit lines are ramped to Vera while the select gates $212_0$ to $212_M$ are turned on. As mentioned earlier, in 3D NAND, one of the channel region, pillar, or bit line can also be ramped up in voltage to cause erasure of attached memory cells. Thus, for simplicity herein, reference to "memory line" should be understood to make reference to any of the SRC line or bit lines in 2D NAND or to any of channel, pillar, or bit lines in 3D NAND. In some embodiments, one or more sub-blocks, to include a physical block, of memory cells are erased during the same true erase sub-operation. A block of memory cells can be generally understood to include four or more sub-blocks, wherein each sub-block includes a separate string of memory cells.

FIG. 4A is a simplified voltage waveform depiction of an erase pulse 400A according to an embodiment. For an erase operation, the local media controller 135 (e.g., control logic) can direct execution of an erase operation by first causing a pre-program pulse 402 to be applied to the memory line (e.g., bit line, source line, or the like), followed by causing the erase pulse 400A to be applied to the memory line, followed by causing one or more program verify pulses 422 to be applied to the memory line. The focus of this disclosure is on the erase pulse 400A that is applied during a true erase sub-operation of an overall erase operation. In various embodiments, the erase pulse 400A includes a ramping period 404, a flattop period 408 that has a pulse width, and a recovery period 410. The control logic can selectively modify the pulse width of the flattop period 408 depending on whether the erase operation was suspended while the erase pulse 400A was in the ramping period 404, as will be discussed in more detail.

FIG. 4B is a simplified block diagram of how a memory line being ramped to an erase voltage affects a number of memory cells coupled to the memory line according to an embodiment. FIG. 4C is an example graph illustrating varying hot-e injection-type disturb effects depending on a ramp rate of the erase voltage according to various embodiments. When a ramping period of the erase pulse 400A is increased up to the erase voltage at a fast (or steep) ramp rate, an erase disturb can occur that causes a select gate (SG) transistor (associated with SGD0) farthest away from the memory line to experience a threshold voltage (Vt) trap-up issue. The SG transistors (referred to as select gates 212 with respect to FIGS. 2A-2B) are controlled to turn on and turn off a string of memory cells, which is typically a sub-block of memory cells.

In such memory devices, the hot-e injection-type disturb can be caused by gate-induced drain leakage (GIDL) of the channel or pillar of the memory array, for example, particularly within 3D-NAND flash with circuit under array (CUA) design, due to a lower potential gradient across the channel or pillar at the SGD0 transistor compared to, for example, at the SGD4 transistor that is closer to the memory line. The GIDL may also impact, to a lesser degree, the channel potential of other SG transistors such as SGD1 through SGD4, where if the ramp rate is sufficiently high, the SG Vt trap-up issue may be observed on more and possibly all of the SG transistors. This charge trap-up issue on the SG transistor associated with at least the SGD0 transistor can impact the stability of the Vt of the SG transistors. Thus, the lack of stability of the Vt levels of the SG transistors can lead to program and/or read failures of corresponding strings of memory cells.

As can be observed with reference to the slower ramp rate erase pulse of FIG. 4C, the hot-e injection-type disturb is less pronounced, and thus the charge trap-up issue can be avoided by employing a longer ramping period 404. The slower ramp rate, however, increases the time for completing the erase operation and increases the likelihood that a suspend command is received during the ramping period 404. The description hereinafter addresses these concerns.

Figure 5A:
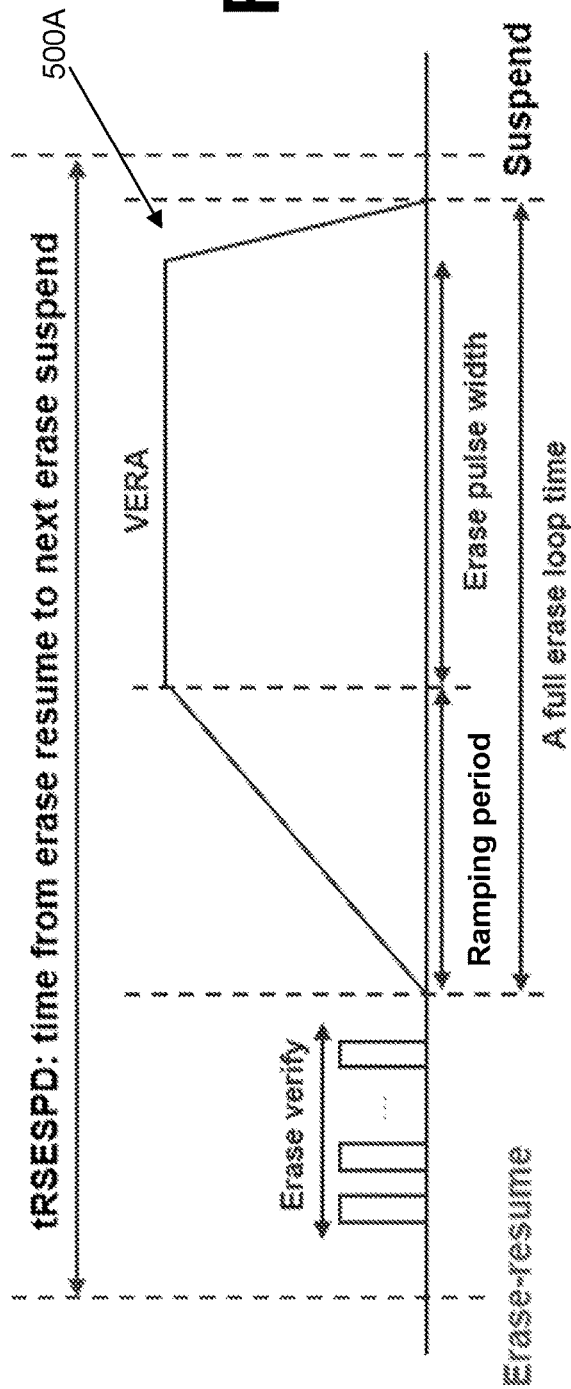
FIG. 5A is an example waveform of a full erase pulse that completes an erase operation at one or more memory cells according to an embodiment.

FIG. 5A is an example waveform of a full erase pulse 500A that completes an erase operation at one or more memory cells according to an embodiment. Maximum specification for erase suspend operation time (tESPD) is set to 150 microseconds (μs). In some embodiments, tESPD is defined as the response time from when the memory device 130 (e.g., NAND) receives an erase suspend command to when the memory device 130 returns to the ready state. A minimum time from resume erase to a next erase suspend (tRSESPD) is currently targeted to a very aggressive number of shorter than 1 millisecond (ms). In some embodiments, an advanced 3D-CUA NAND flash device generally needs a longer block erase time (TBERS) of about ~1.5 ms/loop. These specifications increasingly decrease the time available for the overall erase operation.

Figure 5B:
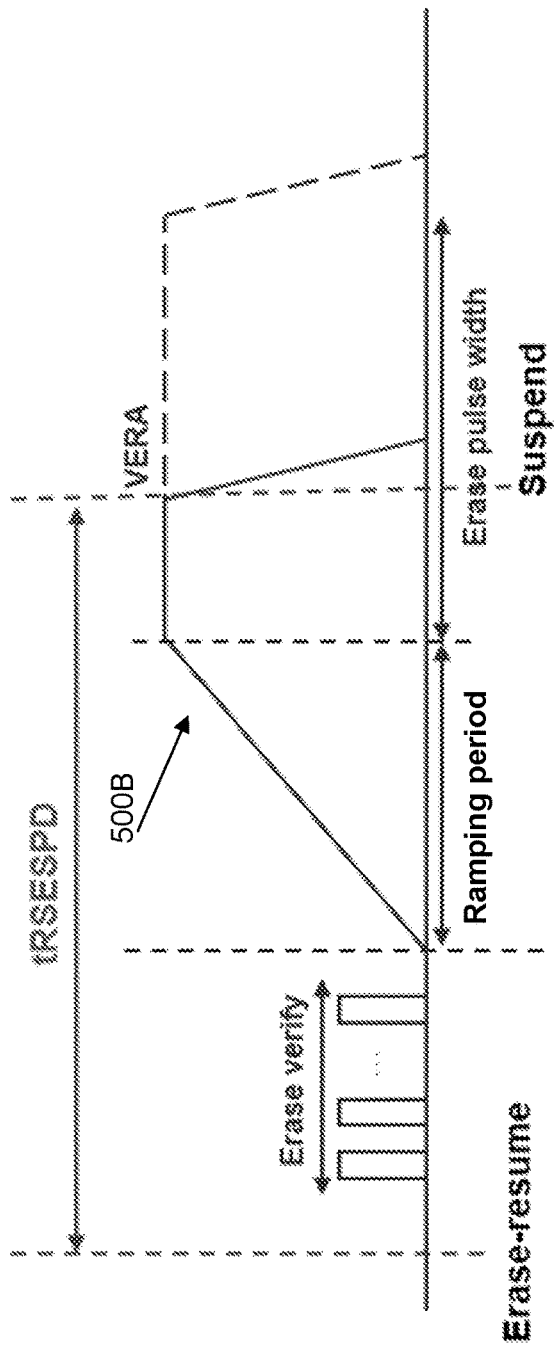
FIG. 5B is an example waveform of a partial erase pulse that suspends the full erase pulse during the flattop period, according to an embodiment.

FIG. 5B is an example waveform of a partial erase pulse 500B that suspends the full erase pulse 500A during the flattop period, according to an embodiment. In some embodiments, a successful NAND flash memory requires shorter read latency time to achieve quality of service (QoS) specifications. To improve read latency time, an erase suspend function, which pauses the erase operation to prioritize a read operation, for example, can be introduced during the flattop period to reduce the wait time for handling a read request. A segment erase feature where the pause of the erase operation is performed during flattop (VERA duration period) is one solution to reach tRSESPD target when the full erase time is quite longer in any particular memory device or component.

FIG. 6A is an example waveform of an incomplete erase pulse 600A that is suspended during a ramping period 604 of an erase pulse according to an embodiment. As discussed, the likelihood increases that the memory device will receive a suspend command during the ramping period 604 of a first (or original) erase pulse and thus need to perform a suspend operation. For example, the erase suspend function of FIG. 5B (or other erase suspend operation) may occur during the ramping period. A start of the erase suspend operation is to discharge 606A the memory line of the erase pulse, resulting in the incomplete erase pulse 600A and the erase operation not being completed.

FIG. 6B is an example waveform of a subsequent erase pulse 600B having a dynamically adjusted pulse width according to an embodiment. As will be discussed in more detail, the memory device 130 (e.g., control logic thereof) can selectively modify a pulse width of a flattop period of the subsequent erase pulse 600B based on a suspend voltage level of the incomplete erase pulse 600A, thus allowing a dynamic pulse width 608. Identifying the suspend voltage level will be discussed in more detail with reference to FIG. 7. If the pulse width of the subsequent erase pulse 600B is shortened based on the suspend voltage level being sufficiently high, then the discharge 606B will occur before the end of a default flattop period.

Figure 7:
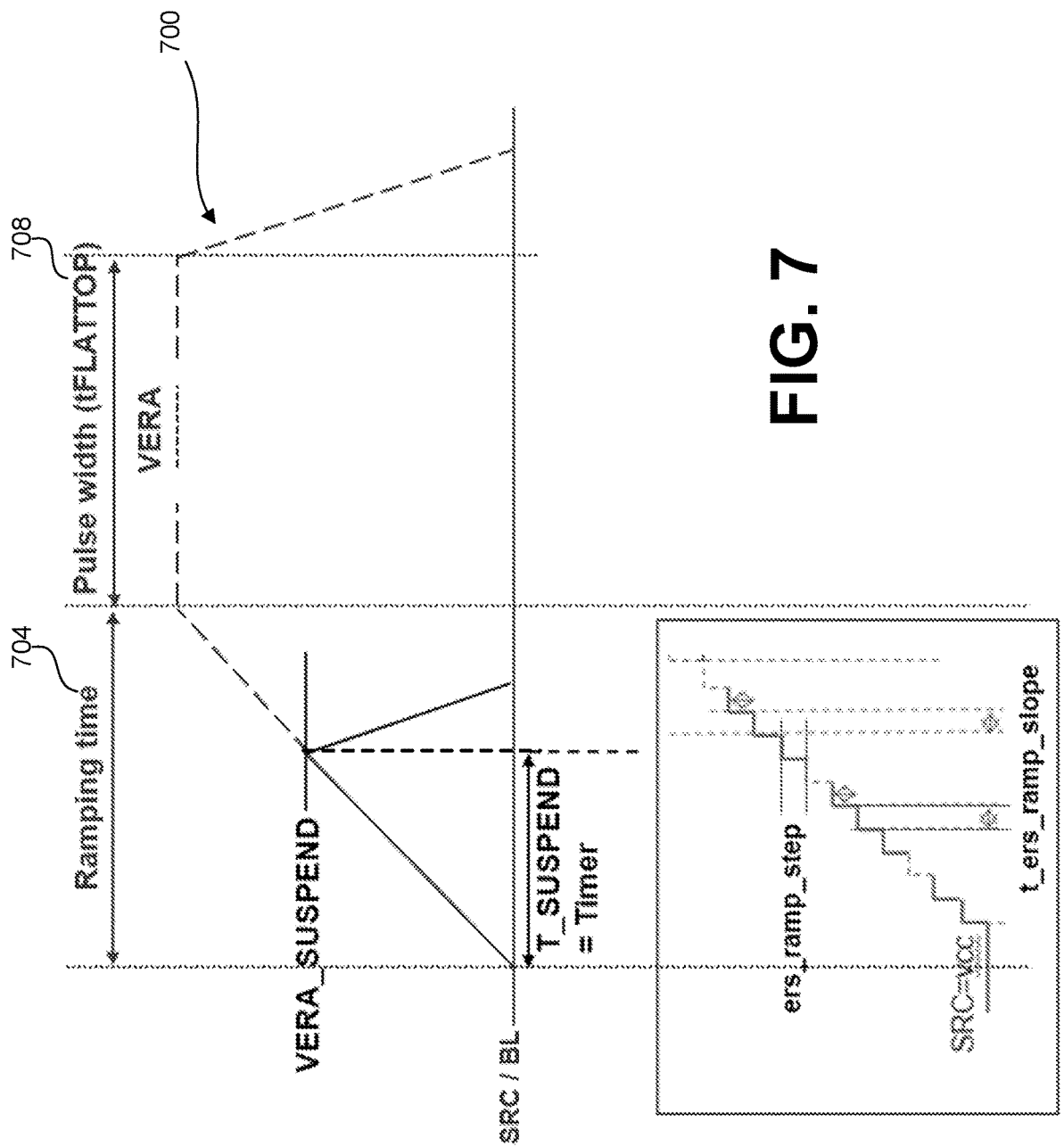
FIG. 7 is an example waveform of an erase pulse that is suspended during the ramping period and that identifies certain variables according to various embodiments.

FIG. 7 is an example waveform of an erase pulse 700 that is suspended during the ramping period and that identifies certain variables according to various embodiments. These variables include a suspend voltage level (VERA_SUSPEND) that is identified (or determined) when the erase operation is suspended during a ramping period 704, an erase voltage (VERA) to which the erase pulse 700 reaches during a flattop period 708, and a suspend pulse period (T_SUSPEND). In various embodiments, to determine the suspend pulse period, the control logic initializes a timer 144 at a beginning of the erase pulse 700, stops the timer in response to detecting a suspend command (e.g., from the host 120 or another I/O agent), and identifies the suspend pulse period from a value of the timer.

In at least some embodiments, an erase ramp step size (ers_ramp_step) is a voltage step size for the ramping period 704 of the pulse and an erase ramp slope (t_ers_ramp_slope) is a time duration for each step of the ramping period 704 as the erase pulse 700 ramps towards the erase voltage (VERA). In at least some embodiments, the control logic determines the suspend voltage level (VERA_SUSPEND) as a product of the erase ramp voltage step (ers_ramp_step) and a suspend pulse period (T_SUSPEND) divided by a slope of the ramping period (t_ers_ramp_slope), as follows.

$$\text{VERA\_SUSPEND} = (T\_\text{SUSPEND}/t\_\text{ers\_ramp\_slope}) * \text{era\_ramp\_step}$$

In this calculation, the suspend pulse period (T_SUSPEND) is a length of the pulse period 704 of the erase pulse 700 before suspension of the erase operation. The control logic can then record (e.g., perform recording of) the suspend voltage level, e.g., within local memory or within memory cell(s) of the memory device 130.

Figure 8:
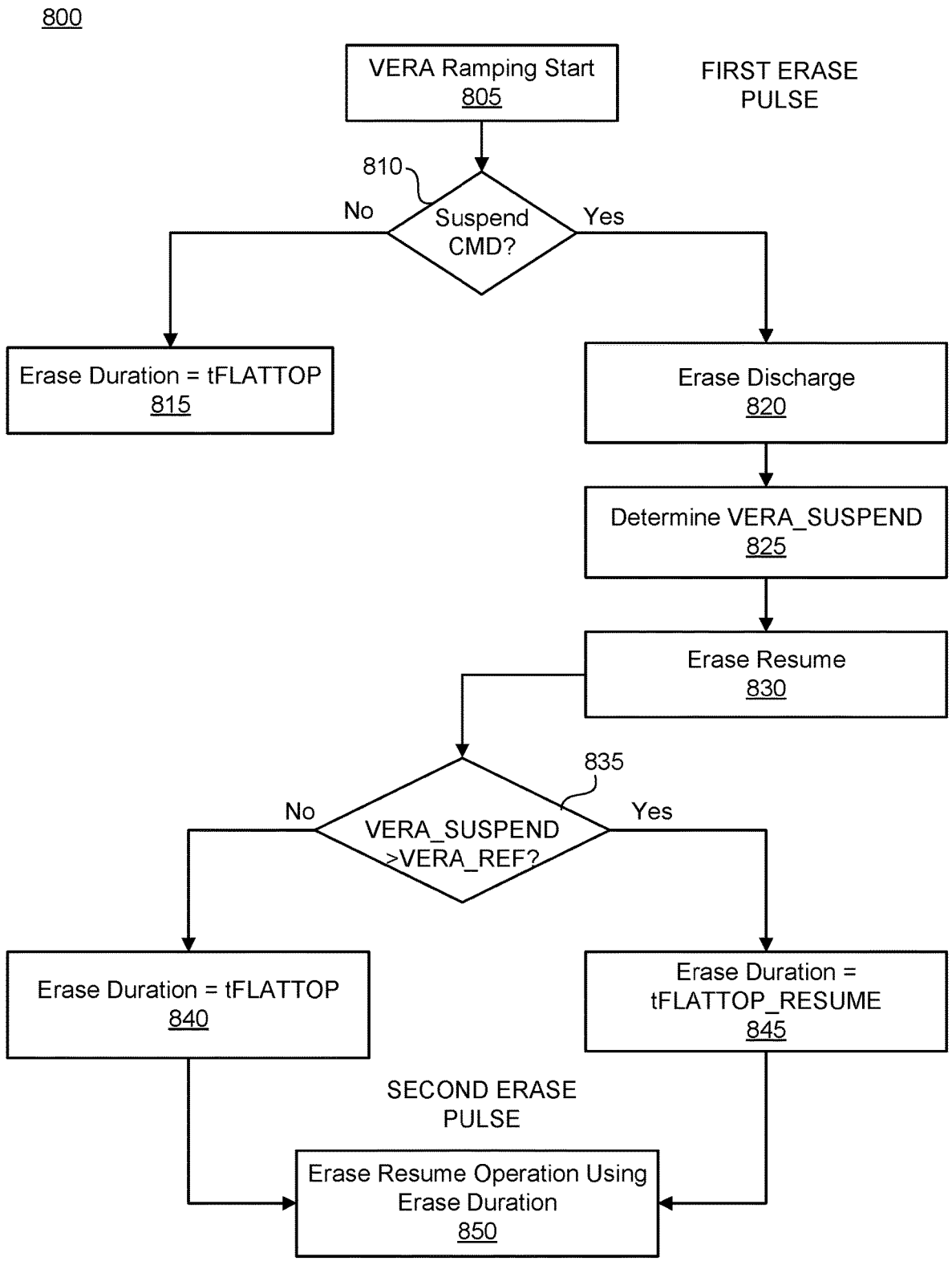
FIG. 8 is a flow chart of a method for adaptive erase pulse width modulation based on erase suspend occurring during the erase pulse ramping period according some embodiments.

FIG. 8 is a flow chart of a method 800 for adaptive erase pulse width modulation based on erase suspend occurring during the erase pulse ramping period according some embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the local media controller 135 of FIGS. 1A-1B that includes an erase operation manager 138. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 805, ramping begins. More specifically, the processing logic causes erase pulse ramping to start of a first erase pulse to perform an erase operation associated with a memory line.

At operation 810, a suspend command may be detected. More specifically, the processing logic determines whether a suspend command has been detected while the first erase pulse is applied to the memory line.

At operation 815, a default duration is used for the flattop period. More specially, in response to detecting no suspend command, the processing logic causes the erase duration of the flattop period be a default flattop period (tFLATTOP).

At operation 820, a suspend command is acted on. More specifically, in response to detecting a suspend command, the processing logic causes the memory line to be discharged, thus beginning to act on the suspend command.

At operation 825, a suspend voltage level is determined. More specifically, the processing logic determines the suspend voltage as a product of an erase ramp voltage step and a suspend pulse period divided by a slope of the ramping period, the suspend pulse period being a length of a pulse period of the first erase pulse before suspension of the erase operation. The processing logic can also record (e.g., buffer, cache, store) the suspend voltage level for future reference.

At operation 830, the erase operation is resumed. More specifically, the processing logic detects an erase resume command and causes the erase operation to be resumed.

At operation 835, the suspend voltage level is compared with a reference voltage. More specifically, the processing logic identifies a reference voltage associated with the ramping period of the first erase pulse that satisfies a threshold percentage of an erase voltage of the first erase pulse (e.g., is within a predetermined percentage of the erase voltage that is close enough to VERA to begin erasing memory cells). The processing logic further determines whether the suspend voltage level (VERA_SUSPEND) satisfies the reference voltage (VERA_REF). In at least some embodiments, to satisfy the reference voltage means the suspend voltage level at least meets or exceeds the reference voltage. The processing logic can then use the results of this determination to selectively modify, as will be discussed, a pulse width of the flattop period of a second erase pulse applied to the memory line during a erase resume operation.

At operation 840, a default duration is used for the flattop period. More specifically, in response to the suspend voltage level not satisfying the reference voltage, the processing logic employs a default flattop period for the pulse width of a second erase pulse. In some embodiments, this second erase pulse is the subsequent pulse that is applied to the wordline upon resume of the erase operation, e.g., during the resume erase operation. FIG. 9A is an example waveform of an erase pulse such as in FIG. 7 where a suspend voltage level does not satisfy a reference voltage according to an embodiment. FIG. 9B is an example waveform of the subsequent erase pulse that is applied to the memory line after resuming an erase operation that was suspended as in FIG. 9A according to some embodiments. The second erase pulse illustrated in FIG. 9B has a complete default duration for the flattop period, for example.

Figure 10A:
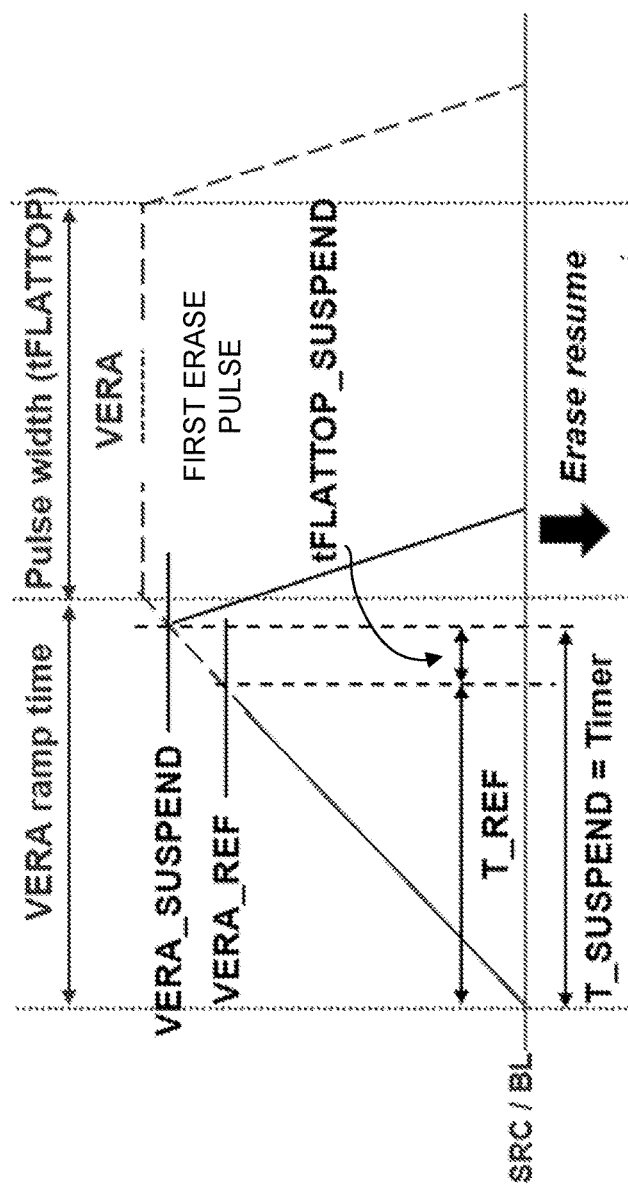
FIG. 10A is an example waveform of an erase pulse such as in FIG. 7 where a suspend voltage level does satisfy the reference voltage according to an embodiment.

At operation 845, the erase duration is modified. More specifically, in response to the suspend voltage level satisfying the reference voltage, the processing logic reduces the pulse width of the second erase pulse by a time difference between, during the ramping period of the first erase pulse, reaching the suspend voltage level and reaching the reference voltage. FIG. 10A is an example waveform of an erase pulse such as in FIG. 7 where a suspend voltage level does satisfy the reference voltage according to an embodiment. The difference between the suspend voltage level and reaching the reference voltage is illustrated in FIG. 10A as "tFLATTOP_SUSPEND" towards the top of the ramping period of the first erase pulse.

Figure 10B:
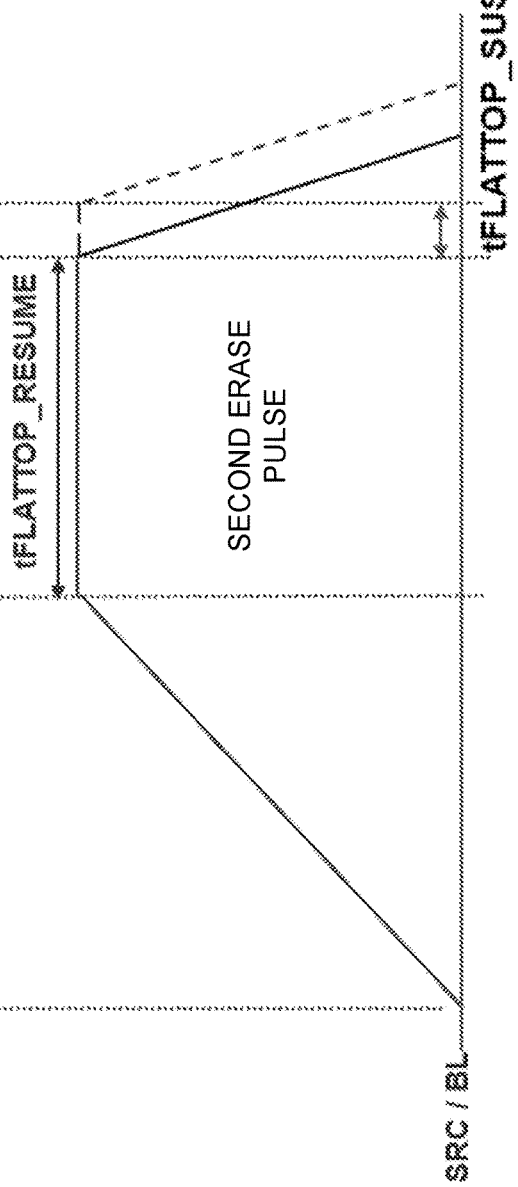
FIG. 10B is an example waveform of a subsequent erase pulse that is applied to the memory line after resuming an erase operation that was suspend as in FIG. 10A according to some embodiments.

FIG. 10B is an example waveform of a subsequent (or second) erase pulse that is applied to the memory line after resuming an erase operation that was suspend as in FIG. 10A according to some embodiments. As illustrated, the second erase pulse has a tFLATTOP_RESUME pulse width that is the default duration (tFLATTOP) less the tFLATTOP_SUSPEND time period.

At operation 450, the second erase pulse is applied to the memory line. More specifically, the processing logic applies this second erase pulse, with the reduced pulse width of the flattop period, to the memory line. This reduces the time it takes to complete the erase resume operation and avoids over-erasing the memory cells coupled to the memory line.

Figure 11:
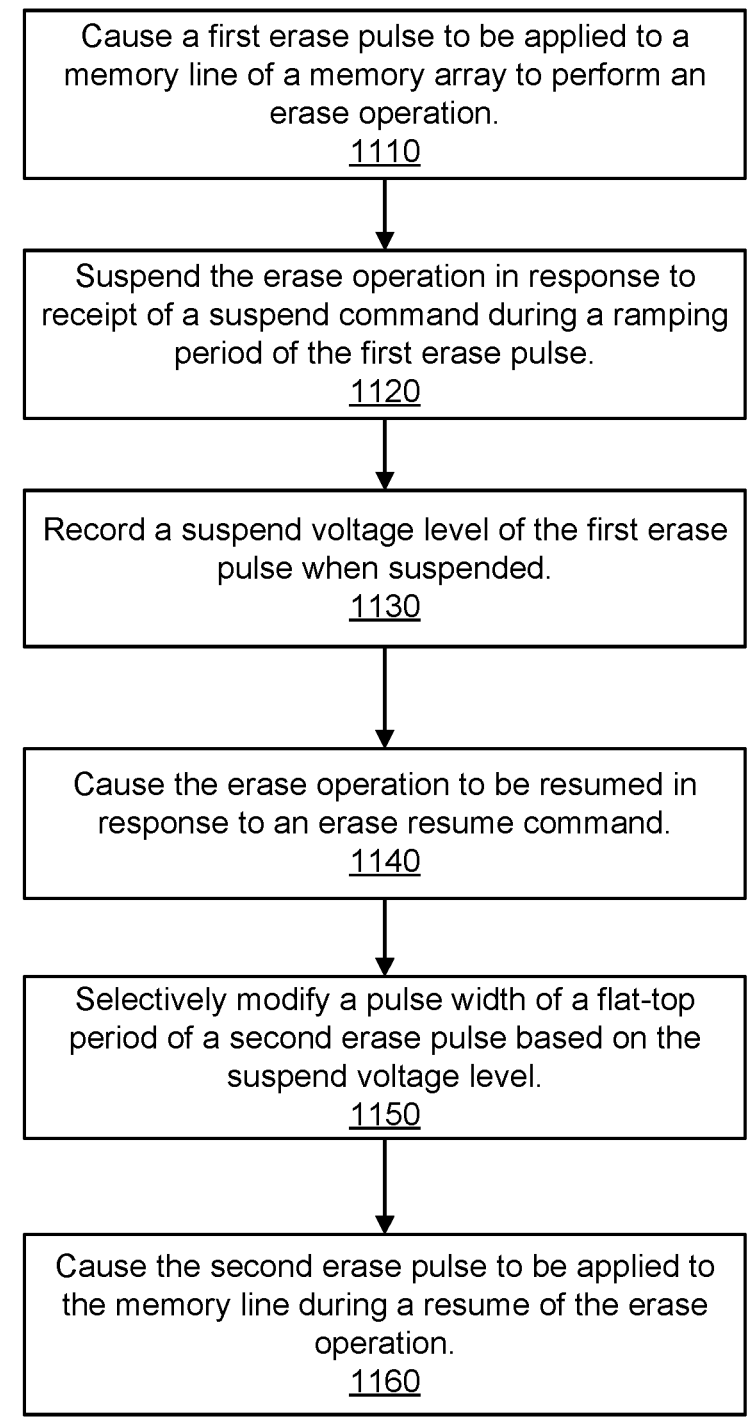
FIG. 11 is a flow chart of a method for adaptive erase pulse width modulation based on erase suspend occurring during an erase pulse ramping period according to at least one embodiment.

FIG. 11 is a flow chart of a method 1100 for adaptive erase pulse width modulation based on erase suspend occurring during an erase pulse ramping period according to at least one embodiment. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the local media controller 135 of FIGS. 1A-1B that includes an erase operation manager 138. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1110, a first erase pulse is applied. More specifically, the processing logic causes a first erase pulse to be applied to a memory line of a memory array to perform an erase operation, the memory line being a conductive line coupled to a string of memory cells.

At operation 1120, the erase operation is suspended. More specifically, the processing logic suspends the erase operation in response to receipt of a suspend command during a ramping period of the first erase pulse (see FIG. 6A).

At operation 1130, the suspend voltage level is recorded. More specifically, the processing logic records a suspend voltage level of the first erase pulse when suspended.

At operation 1140, an erase operation is resumed. More specifically, the processing logic causes an erase operation to be resumed in response to an erase resume command.

At operation 1150, a pulse width of a second erase pulse is modified. More specifically, the processing logic selectively modifies a pulse width of a flattop period of a second erase pulse based on the suspend voltage level, as discussed in detail with reference to FIGS. 6B-10B.

At operation 1140, the second erase pulse is applied. More specifically, the processing logic causes the second erase pulse to be applied to the memory line during a resume of the erase operation.

Figure 12:
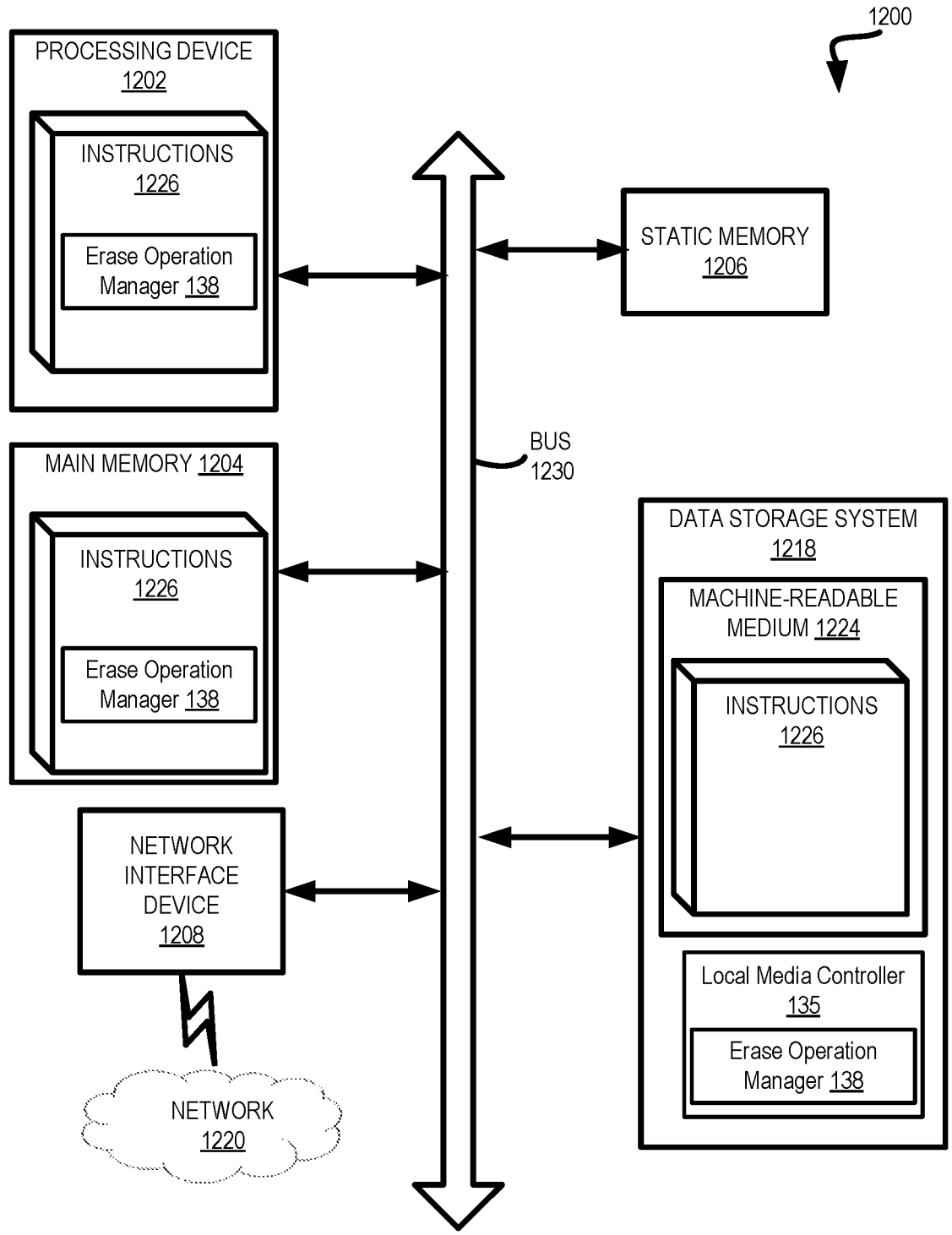
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1210 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1228 for performing the operations and steps discussed herein. The computer system 1200 can further include a network interface device 1212 to communicate over the network 1220.

The data storage system 1218 can include a machine-readable storage medium 1224 (also known as a computer-readable medium) on which is stored one or more sets of instructions 1228 or software embodying any one or more of the methodologies or functions described herein. The data storage system 1218 can further include the local media controller 135, which includes the erase operation manager 138, which were previously discussed. The instructions 1228 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1A.

In one embodiment, the instructions 1226 include instructions to implement functionality corresponding to a controller (e.g., the memory sub-system controller 115 of FIG. 1A). While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., non-transitory computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising memory cells; and
   control logic operatively coupled with the memory array, the control logic to perform operations comprising:
   causing a first erase pulse to be applied to a memory line of the memory array to perform an erase operation, the memory line being a conductive line coupled to a string of the memory cells;
   suspending the erase operation in response to receipt of a suspend command during a ramping period of the first erase pulse;

recording a suspend voltage level of the first erase pulse when suspended;
causing the erase operation to be resumed in response to an erase resume command;
selectively modifying a pulse width of a flattop period of a second erase pulse based on the suspend voltage level; and
causing the second erase pulse to be applied to the memory line during a resume of the erase operation.

2. The memory device of claim 1, wherein the operations further comprise detecting the suspend command while the first erase pulse is applied to the memory line, and in response to detecting the suspend command:
causing the memory line to be discharged; and
retrieving the suspend voltage level from internal memory.

3. The memory device of claim 1, wherein the operations further comprise determining the suspend voltage level as a product of an erase ramp voltage step and a suspend pulse period divided by a slope of the ramping period, the suspend pulse period being a length of a pulse period of the first erase pulse before suspension of the erase operation.

4. The memory device of claim 3, wherein the operations further comprise:
initializing a timer at a beginning of the first erase pulse;
stopping the timer in response to detecting the suspend command; and
identifying the suspend pulse period from a value of the timer.

5. The memory device of claim 1, wherein the operations further comprise:
identifying a reference voltage associated with the ramping period of the first erase pulse that satisfies a threshold percentage of an erase voltage of the first erase pulse;
determining that the suspend voltage level does not satisfy the reference voltage; and
employing a default flattop period for the pulse width of the second erase pulse.

6. The memory device of claim 5, wherein the threshold percentage is within a predetermined percentage of the erase voltage.

7. The memory device of claim 1, wherein the operations further comprise:
identifying a reference voltage associated with the ramping period of the first erase pulse that satisfies a threshold percentage of an erase voltage of the first erase pulse;
determining that the suspend voltage level satisfies the reference voltage; and
reducing the pulse width of the second erase pulse by a time difference between, during the ramping period of the first erase pulse, reaching the suspend voltage level and reaching the reference voltage.

8. The memory device of claim 7, wherein the threshold percentage is within a predetermined percentage of the erase voltage.

9. A method comprising:
causing a first erase pulse to be applied to a memory line of a memory array to perform an erase operation, the memory line being a conductive line coupled to a string of memory cells;
suspending the erase operation in response to receipt of a suspend command during a ramping period of the first erase pulse;
recording a suspend voltage level of the first erase pulse when suspended;
causing the erase operation to be resumed in response to an erase resume command;
selectively modifying a pulse width of a flattop period of a second erase pulse based on the suspend voltage level; and
causing the second erase pulse to be applied to the memory line during a resume of the erase operation.

10. The method of claim 9, further comprising detecting the suspend command while the first erase pulse is applied to the memory line, and in response to detecting the suspend command:
causing the memory line to be discharged; and
retrieving the suspend voltage level from internal memory.

11. The method of claim 9, further comprising determining the suspend voltage level as a product of an erase ramp voltage step and a suspend pulse period divided by a slope of the ramping period, the suspend pulse period being a length of a pulse period of the first erase pulse before suspension of the erase operation.

12. The method of claim 11, further comprising:
initializing a timer at a beginning of the first erase pulse;
stopping the timer in response to detecting the suspend command; and
identifying the suspend pulse period from a value of the timer.

13. The method of claim 9, further comprising:
identifying a reference voltage associated with the ramping period of the first erase pulse that satisfies a threshold percentage of an erase voltage of the first erase pulse;
determining that the suspend voltage level does not satisfy the reference voltage; and
employing a default flattop period of the pulse width for the second erase pulse.

14. The method of claim 9, further comprising:
identifying a reference voltage associated with the ramping period of the first erase pulse that satisfies a threshold percentage of an erase voltage of the first erase pulse;
determining that the suspend voltage level satisfies the reference voltage; and
reducing the pulse width of the second erase pulse by a time difference between, during the ramping period of the first erase pulse, reaching the suspend voltage level and reaching the reference voltage.

15. A method comprising:
detecting a suspend command during a ramping period of a first erase pulse that is applied to a memory line of a memory array during an erase operation, the memory line being a conductive line coupled to a string of memory cells;
determining a suspend voltage level of the first erase pulse;
causing a discharge of the memory line;
detecting an erase resume command associated with the erase operation; and
in response to detecting the erase resume command:
selectively modifying a pulse width of a flattop period of a second erase pulse based on the suspend voltage level; and
causing the second erase pulse to be applied to the memory line.

16. The method of claim 15, wherein determining the suspend voltage level comprises determining a product of an erase ramp voltage step and a suspend pulse period divided by a slope of the ramping period, the suspend pulse period being a length of a pulse period of the first erase pulse before suspension of the erase operation.

17. The method of claim 16, further comprising:
initializing a timer at a beginning of the first erase pulse; and
stopping the timer in response to detecting the suspend command; and
identifying the suspend pulse period from a value of the timer.

18. The method of claim 15, further comprising recording the suspend voltage level for use during a resume of the erase operation.

19. The method of claim 15, further comprising:
identifying a reference voltage associated with the ramping period of the first erase pulse that satisfies a threshold percentage of an erase voltage of the first erase pulse;
determining that the suspend voltage level does not satisfy the reference voltage; and
employing a default flattop period of the pulse width for the second erase pulse.

20. The method of claim 15, further comprising:
identifying a reference voltage associated with the ramping period of the first erase pulse that satisfies a threshold percentage of an erase voltage of the first erase pulse;
determining that the suspend voltage level satisfies the reference voltage; and
reducing the pulse width of the second erase pulse by a time difference between, during the ramping period of the first erase pulse, reaching the suspend voltage level and reaching the reference voltage.

* * * * *